United States Patent
Takagi

(10) Patent No.: US 9,144,159 B2
(45) Date of Patent: Sep. 22, 2015

(54) ELECTRONIC DEVICE, METHOD FOR MANUFACTURING THEREOF, AND ELECTRONIC APPARATUS

(71) Applicant: Seiko Epson Corporation, Tokyo (JP)

(72) Inventor: Shigekazu Takagi, Suwa (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 13/760,626

(22) Filed: Feb. 6, 2013

(65) Prior Publication Data

US 2013/0208438 A1 Aug. 15, 2013

(30) Foreign Application Priority Data

Feb. 9, 2012 (JP) ................................. 2012-026170

(51) Int. Cl.
- *H05K 5/02* (2006.01)
- *H05K 13/00* (2006.01)
- *B81B 7/00* (2006.01)
- *H05K 1/18* (2006.01)

(52) U.S. Cl.
CPC *H05K 5/02* (2013.01); *B81B 7/007* (2013.01); *H05K 1/181* (2013.01); *H05K 13/00* (2013.01); *B81B 2207/097* (2013.01); *B81C 2203/0145* (2013.01); *H05K 2201/09072* (2013.01); *H05K 2201/2045* (2013.01); *Y10T 29/49155* (2015.01)

(58) Field of Classification Search
CPC ................................. H05K 5/02; H05K 13/00
USPC ............. 361/809; 73/514.32, 514.36, 514.38, 73/514.12
See application file for complete search history.

(56) References Cited

U.S. PATENT DOCUMENTS

| 5,627,317 | A | 5/1997 | Offenberg et al. |
| 5,719,073 | A | 2/1998 | Shaw et al. |
| 5,987,989 | A * | 11/1999 | Yamamoto et al. ........ 73/514.24 |
| 6,170,332 | B1 | 1/2001 | MacDonald et al. |
| 6,171,881 | B1 | 1/2001 | Fujii |
| 6,388,300 | B1 * | 5/2002 | Kano et al. .................... 257/419 |
| 6,494,096 | B2 | 12/2002 | Sakai et al. |
| 2009/0007669 | A1* | 1/2009 | Fukaura ..................... 73/514.32 |
| 2011/0291644 | A1 | 12/2011 | Kanemoto |
| 2012/0111615 | A1 | 5/2012 | Yoda et al. |

FOREIGN PATENT DOCUMENTS

| JP | 05-304303 | | 11/1993 |
| JP | 07-333078 | | 12/1995 |
| JP | 08-506857 | | 7/1996 |
| JP | 2000-286430 | | 10/2000 |
| JP | 2007171040 A | * | 7/2007 |
| JP | 2011-247812 | | 12/2011 |
| JP | 2012-098208 | | 5/2012 |

* cited by examiner

*Primary Examiner* — Dion R Ferguson
*Assistant Examiner* — Mandeep Buttar
(74) *Attorney, Agent, or Firm* — Harness, Dickey & Pierce, P.L.C.

(57) ABSTRACT

An electronic device includes: a first member having a first surface; a second member placed on the side of the first surface; a functional element accommodated in a cavity formed by the first member and the second member; an external connection terminal disposed outside of the cavity on the side of the first surface of the first member; a groove portion disposed on the side of the first surface of the first member and extending from the inside to the outside of the cavity; a wiring disposed within the groove portion and electrically connecting the functional element with the external connection terminal; a first through-hole disposed at a position of the second member, the position overlapping the groove portion in plan view; and a filling member disposed within the first through-hole and filling the groove portion.

7 Claims, 13 Drawing Sheets

ELECTRONIC DEVICE, METHOD FOR MANUFACTURING THEREOF, AND ELECTRONIC APPARATUS

BACKGROUND

1. Technical Field

The present invention relates to an electronic device, a method for manufacturing thereof, and an electronic apparatus.

2. Related Art

In recent years, electronic devices including a functional element which detects a physical quantity using, for example, a silicon MEMS (Micro Electro Mechanical Systems) technique have been developed.

As the functional element, a physical quantity sensor element has been known. The physical quantity sensor element has, for example, a fixed electrode fixedly arranged and a movable electrode facing the fixed electrode with a spacing and displaceably disposed. The physical quantity sensor element detects a physical quantity such as acceleration based on an electrostatic capacitance between the fixed electrode and the movable electrode (refer to JP-A-2000-286430).

Such a functional element is accommodated in a cavity of a package and is used as an electronic device.

However, in the electronic device described above, a wiring electrically connected to the functional element needs to be drawn from the inside to the outside of the cavity, so that it is sometimes difficult to obtain a cavity with high airtightness. When the airtightness of the cavity is lowered, the detection sensitivity of the functional element is sometimes lowered.

SUMMARY

An advantage of some aspects of the invention is to provide an electronic device in which a cavity with high airtightness can be easily formed. Another advantage of some aspects of the invention is to provide a method for manufacturing the electronic device in which a cavity with high airtightness can be easily formed. Still another advantage of some aspects of the invention is to provide an electronic apparatus including the electronic device.

The invention can be realized as the following modes or application examples.

APPLICATION EXAMPLE 1

This application example is directed to an electronic device including: a first member having a first surface; a second member placed on the side of the first surface of the first member; a functional element accommodated in a cavity formed by the first member and the second member; an external connection terminal disposed outside of the cavity on the side of the first surface of the first member; a groove portion disposed on the side of the first surface of the first member and extending from the inside to the outside of the cavity; a wiring disposed within the groove portion and electrically connecting the functional element with the external connection terminal; a first through-hole disposed at a position of the second member, the position overlapping the groove portion in plan view; and a filling member disposed within the first through-hole and filling the groove portion.

According to the electronic device, the cavity can be hermetically sealed by the filling member, so that the cavity with high airtightness can be easily formed.

It is noted that, in the descriptions concerning the invention, the phrase "electrically connect" or "electrically connected" may be used, for example, in a manner as "a specific member (hereinafter referred to as "A member") "electrically connected" to another specific member (hereinafter referred to as "B member")". In the descriptions concerning the invention, in the case of such an example, the phrase "electrically connect" or "electrically connected" is used, while assuming that it includes the case in which A member and B member are electrically connected indirect contact with each other, and the case in which A member and B member are electrically connected via another member.

APPLICATION EXAMPLE 2

In the electronic device according to the application example, the material of the first member may be glass, the material of the second member may be silicon, and the first member and the second member may be anodically bonded together.

According to such an electronic device, the second member can be strongly bonded to the first member, so that the impact resistance of the electronic device can be improved. Further, when, for example, the first member and the second member are bonded together with an adhesive member such as glass frit, a region is required to some extent as a bonding margin because the adhesive member spreads in bonding. However, such a region can be reduced according to anodic bonding. Therefore, a reduction in the size of the electronic device can be achieved.

APPLICATION EXAMPLE 3

In the electronic device according to the application example, the first through-hole may have a tapered shape in which the opening size of the first through-hole decreases toward the side of the first member.

According to such an electronic device, the filling member can be easily formed on the inner surface of the first through-hole.

APPLICATION EXAMPLE 4

In the electronic device according to the application example, the filling member may be an insulating film.

According to such an electronic device, when a plurality of wirings are disposed, the plurality of wirings can be prevented from short-circuiting with each other.

APPLICATION EXAMPLE 5

In the electronic device according to the application example, the electronic device may further include: a second through-hole disposed in the second member and being in communication with the cavity; and a sealing member closing the second through-hole.

According to such an electronic device, an inert gas (for example, nitrogen gas) atmosphere can be established in the cavity through the second through-hole. Moreover, the degree of vacuum of the cavity can be controlled through the second through-hole.

APPLICATION EXAMPLE 6

In the electronic device according to the application example, a recess may be disposed in a surface of the second member, the surface facing the wiring.

According to such an electronic device, a parasitic capacitance between the wiring and the second member can be reduced due to the recess. With this configuration, the high sensitivity of the electronic device can be achieved.

APPLICATION EXAMPLE 7

This application example is directed to a method for manufacturing an electronic device, including: forming a wiring within a groove portion disposed on the side of a first surface of a first member made of glass; forming, on the side of the first surface of the first member, an external connection terminal electrically connected with the wiring; forming, on the side of the first surface of the first member, a functional element electrically connected with the wiring; preparing a second member made of silicon and having a through-hole disposed therein, and anodically bonding the first member and the second member together such that the through-hole and the groove portion overlap each other in plan view, to accommodate the functional element in a cavity surround by the first member and the second member; and filling a filling member within the groove portion from the through-hole.

According to the method for manufacturing the electronic device, the cavity can be hermetically sealed by the filling member, so that the electronic device including the cavity with high airtightness can be easily formed. Further, the second member can be strongly bonded to the first member by anodic bonding, so that an improvement in the impact resistance of the electronic device can be achieved. Further, when, for example, the first member and the second member are bonded together with an adhesive member such as glass frit, a region is required to some extent as a bonding margin because the adhesive member spreads in bonding. However, such a region can be reduced according to anodic bonding. Therefore, a reduction in the size of the electronic device can be achieved.

APPLICATION EXAMPLE 8

In the method for manufacturing the electronic device according to the application example, the through-hole may be formed by wet etching.

According to such a method for manufacturing the electronic device, the first through-hole can be made into a tapered shape in which the opening size of the first through-hole decreases toward the side of the first member. With this configuration, the filling member can be easily formed on the inner surface of the first through-hole.

APPLICATION EXAMPLE 9

This application example is directed to an electronic apparatus including the electronic device according to the application example.

According to the electronic apparatus, since the electronic device according to the application example is included, high sensitivity can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiment of the invention will be described in detail using the drawings. The embodiments described below does not unduly limit the contents of the invention set forth in the appended claims. Moreover, not all of configurations described below are indispensable constituent requirements of the invention.

1. Electronic Device

Figure 1:
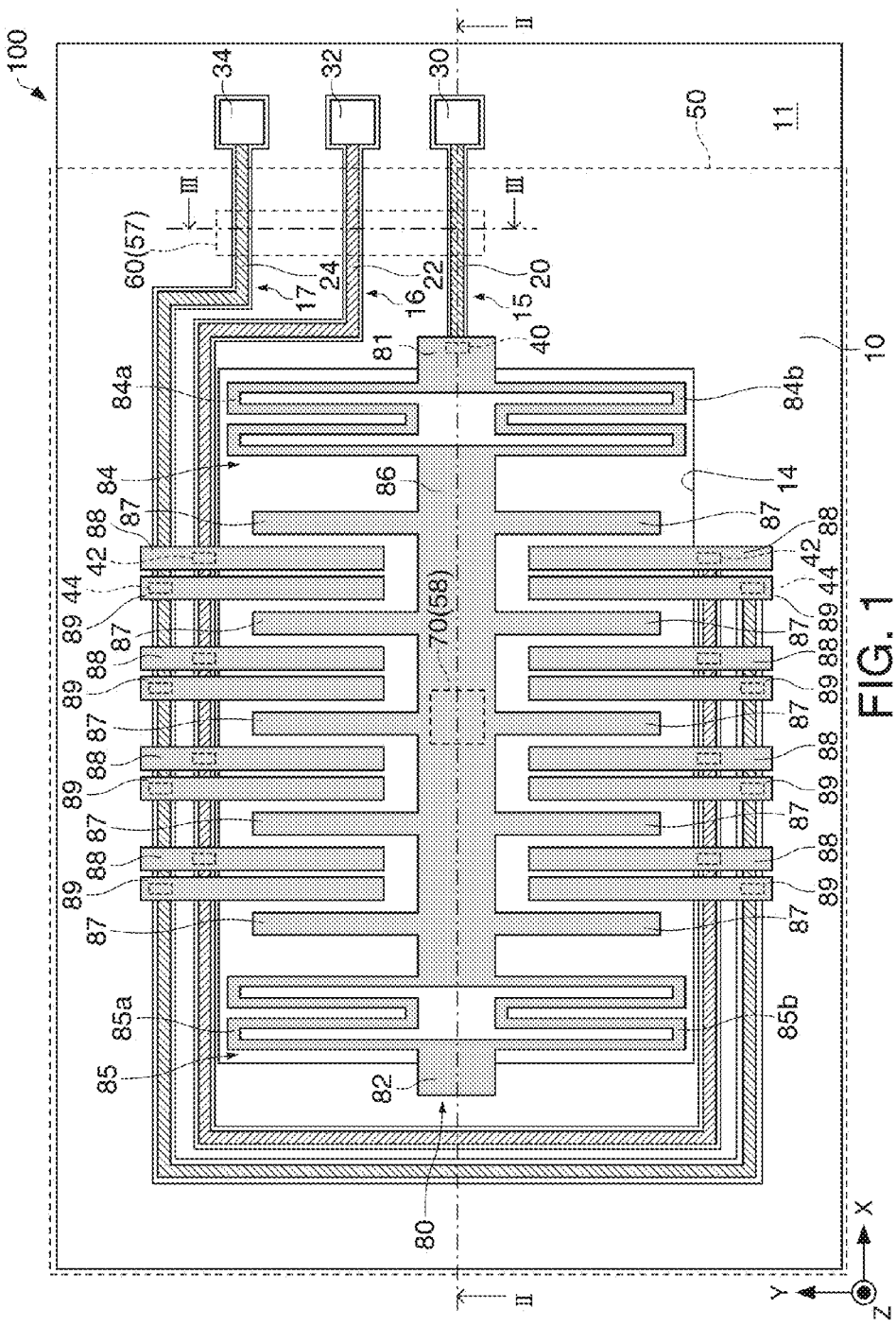
FIG. 1 is a plan view schematically showing an electronic device according to an embodiment.
Figure 2:
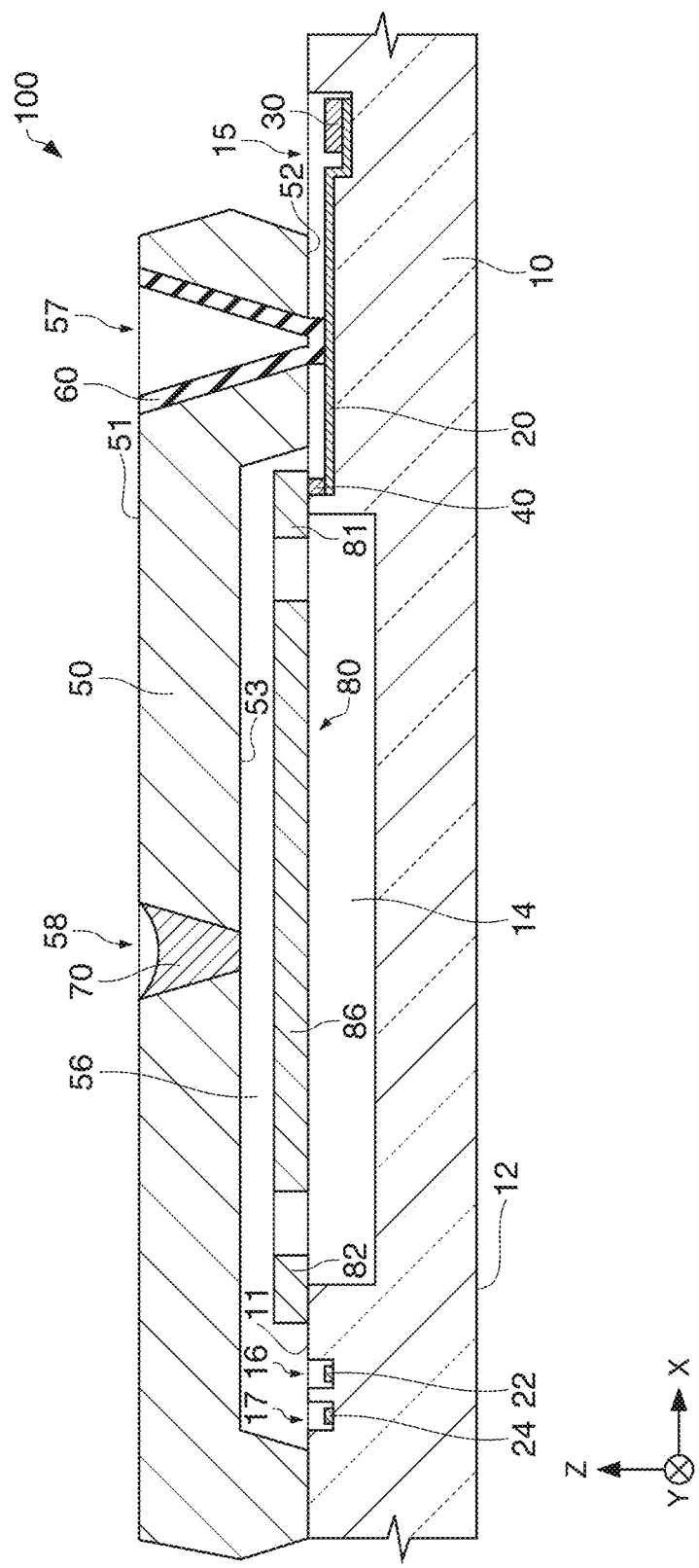
FIG. 2 is a cross-sectional view schematically showing the electronic device according to the embodiment.
Figure 3:
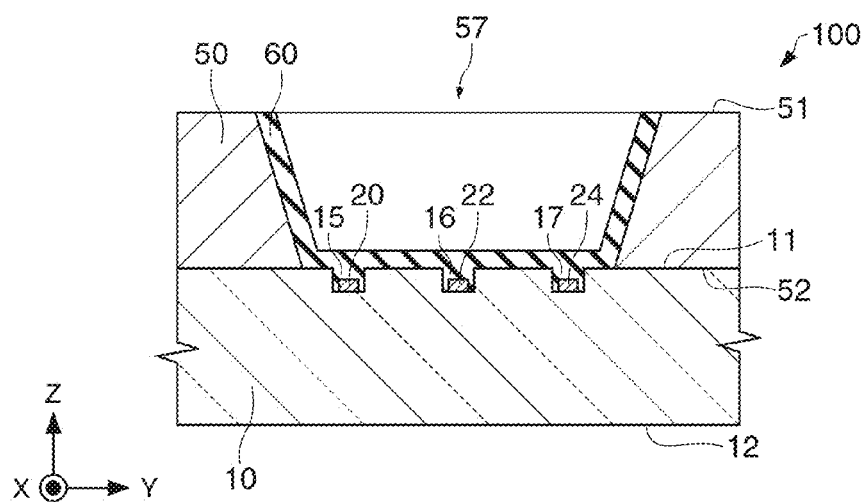
FIG. 3 is a cross-sectional view schematically showing the electronic device according to the embodiment.

First, an electronic device according to the embodiment will be described with reference to the drawings. FIG. 1 is a plan view schematically showing the electronic device 100 according to the embodiment. FIG. 2 is a cross-sectional view taken along line II-II of FIG. 1, schematically showing the electronic device 100 according to the embodiment. FIG. 3 is a cross-sectional view taken along line III-III of FIG. 1, schematically showing the electronic device 100 according to the embodiment. In FIGS. 1 to 3, an X-axis, a Y-axis, and a Z-axis are illustrated as three axes orthogonal to each other.

As shown in FIGS. 1 to 3, the electronic device 100 includes a base substance (first member) 10, a groove portion 15, a wiring 20, an external connection terminal 30, a lid (second member) 50, a first through-hole (through-hole) 57, a filling member 60, and a functional element 80. Further, the electronic device 100 can include groove portions 16 and 17, wirings 22 and 24, external connection terminals 32 and 34, a second through-hole 58, and a sealing member 70. For convenience sake, the lid 50, the filling member 60, and the sealing member 70 are illustrated in a perspective manner in FIG. 1.

The material of the base substance 10 is, for example, glass or silicon. As shown in FIG. 2, the base substance 10 has a first surface 11 and a second surface 12 on the side opposed to the first surface 11. In the first surface 11, a recess 14 is disposed. Above the recess 14, a movable portion 86 and movable electrode portions 87 of the functional element 80 are arranged. The movable portion 86 and the movable electrode portions 87 can move to a desired direction due to the recess 14 without being obstructed by the base substance 10. The planar shape (a shape when viewed from a Z-axis direction) of the recess 14 is not particularly limited but is a rectangle in the example shown in FIG. 1.

The groove portion 15 is disposed in the first surface 11 of the base substance 10. The groove portion 15 extends from the inside to the outside of the cavity 56 formed by the base substance 10 and the lid 50. The groove portion 15 has, for example, a planar shape corresponding to the planar shape of the wiring 20 and the external connection terminal 30.

Similarly, the groove portions 16 and 17 are disposed in the first surface 11 of the base substance 10. In the example shown in FIG. 1, the groove portions 16 and 17 are disposed so as to be along the circumference of the recess 14. The groove portions 16 and 17 extend from the inside to the outside of the cavity 56. The groove portion 16 has, for example, a planar shape corresponding to the planar shape of the wiring 22 and the external connection terminal 32. The groove portion 17 has, for example, a planar shape corresponding to the planar shape of the wiring 24 and the external connection terminal 34.

The depth (the size in the Z-axis direction) of the groove portions 15, 16, and 17 is greater than the thickness (the size in the Z-axis direction) of the wirings 20, 22, and 24 and the external connection terminals 30, 32, and 34. With this configuration, the wirings 20, 22, and 24 and the external connection terminals 30, 32, and 34 can be prevented from protruding higher (a +Z direction) than the first surface 11.

The wiring 20 is disposed within the groove portion 15. More specifically, the wiring 20 is disposed on a surface of the base substance 10, the surface defining a bottom surface of the groove portion 15. The wiring 20 electrically connects the functional element 80 with the external connection terminal 30. In the illustrated example, the wiring 20 is connected to a fixed portion 81 of the functional element 80 via a contact portion 40 disposed within the groove portion 15.

The wiring 22 is disposed within the groove portion 16. More specifically, the wiring 22 is disposed on a surface of the base substance 10, the surface defining a bottom surface of the groove portion 16. The wiring 22 electrically connects the functional element 80 with the external connection terminal 32. In the illustrated example, the wiring 22 is connected to fixed electrode portions 88 of the functional element 80 via contact portions 42.

The wiring 24 is disposed within the groove portion 17. More specifically, the wiring 24 is disposed on a surface of the base substance 10, the surface defining a bottom surface of the groove portion 17. The wiring 24 electrically connects the functional element 80 with the external connection terminal 34. In the illustrated example, the wiring 24 is connected to fixed electrode portions 89 of the functional element 80 via contact portions 44.

The external connection terminal 30 is disposed on the side of the first surface 11 of the base substance 10. In the example shown in FIG. 2, the external connection terminal 30 is disposed on the wiring 20 within the groove portion 15. The external connection terminal 30 is arranged outside of the cavity 56. That is, the external connection terminal 30 is disposed at a position not overlapping the lid 50.

Similarly, the external connection terminals 32 and 34 are disposed on the side of the first surface 11 of the base substance 10. For example, the external connection terminal 32 is disposed on the wiring 22 within the groove portion 16, while the external connection terminal 34 is disposed on the wiring 24 within the groove portion 17. The external connection terminals 32 and 34 are arranged outside of the cavity 56. In the example shown in FIG. 1, the external connection terminals 30, 32, and 34 are arranged in parallel along the Y-axis.

The material of the wirings 20, 22, and 24 and the external connection terminals 30, 32, and 34 is, for example, ITO (Indium Tin Oxide), aluminum, gold, platinum, titanium, tungsten, chromium, or the like. The material of the contact portions 40, 42, and 44 is, for example, gold, copper, aluminum, platinum, titanium, tungsten, chromium, or the like. In the case in which the material of the wirings 20, 22, and 24 and the external connection terminals 30, 32, and 34 is a transparent electrode material such as ITO, when the base substance 10 is transparent, a foreign substance existing on, for example, the wirings 20, 22, and 24 or on the external connection terminals 30, 32, and 34 can be visually recognized easily from the side of the second surface 12 of the base substance 10.

In the above, the electronic device 100 including the three wirings 20, 22, and 24 and the three external connection terminals 30, 32, and 34 has been described as an example. However, the numbers of wirings and external connection terminals can be appropriately changed depending on the shape or number of the functional element 80.

The lid 50 is placed on the first surface 11 of the base substance 10. In the example shown in FIGS. 2 and 3, the lid 50 is placed on the base substance 10. The lid 50 has a third surface 51 and a fourth surface 52 on the side opposed to the third surface 51. The fourth surface 52 can include a portion bonded with the base substance 10 (the first surface 11). A recess forming the cavity 56 is disposed in the fourth surface 52, which enables the lid 50 to have a fifth surface 53 defining the cavity 56.

As shown in FIG. 2, the wiring 20 is disposed within the groove portion 15, whereby the lid 50 is arranged spaced apart from the wiring 20. More specifically, the fourth surface 52 of the lid 50 includes a portion arranged to face the wiring 20 via a gap. Similarly, the fourth surface 52 includes portions arranged to face the wirings 22 and 24 via gaps.

The material of the lid 50 is, for example, silicon or glass. A method for bonding the lid 50 and the base substance 10 together is not particularly limited. For example, when the material of the base substance 10 is glass and the material of the lid 50 is silicon, the base substance 10 and the lid 50 can be anodically bonded together.

The base substance 10 and the lid 50 can constitute a package. The base substance 10 and the lid 50 can form the cavity 56, in which the functional element 80 can be accommodated. The cavity 56 is hermetically sealed in, for example, an inert gas (for example, nitrogen gas) atmosphere or a reduced-pressure state.

The first through-hole 57 is disposed in the lid 50. As shown in FIG. 1, the first through-hole 57 is disposed, in plan view (viewed from the Z-axis direction), at a position overlapping the groove portions 15, 16, and 17. In the example shown in FIG. 3, the first through-hole 57 is disposed above the groove portions 15, 16, and 17 (above the wirings 20, 22, and 24).

As shown in FIGS. 2 and 3, the first through-hole 57 is disposed from the third surface 51 to the fourth surface 52 of the lid 50, penetrating through the lid 50 in the Z-axis direction. It is preferable that the first through-hole 57 has, for example, a tapered shape in which the opening size of the first through-hole decreases toward the side of the base substance 10 (from the third surface 51 toward the fourth surface 52). In such a form, the filling member 60 (described later) is easily deposited to the hole bottom in the deposition of the filling member.

In the illustrated example, one first through-hole 57 overlapping the groove portions 15, 16, and 17 in plan view is disposed. However, a plurality of through-holes may be disposed corresponding to the plurality of groove portions 15, 16, and 17. In such a form, for example, the bonding area of the base substance 10 and the lid 50 can be increased, so that the bonding strength can be increased.

The second through-hole 58 is disposed from the third surface 51 to the fifth surface 53 of the lid 50, penetrating through the lid 50 in the Z-axis direction. The second through-hole 58 is in communication with the cavity 56. It is preferable that the second through-hole 58 has, for example, a tapered shape in which the opening size of the second through-hole decreases toward the side of the base substance 10 (from the third surface 51 toward the fifth surface 53). In such a form, the drop of a solder ball (described later) can be prevented in the melting of the solder ball. Moreover, since the structure has an opening area narrowing toward the side of the cavity 56, sealing can be performed more reliably.

As shown in FIGS. 2 and 3, the filling member 60 is disposed within the first through-hole 57 and within the groove portions 15, 16, and 17 and fills the groove portions 15, 16, and 17. In the example shown in FIG. 2, the filling member 60 fills a portion of the groove portion 15. As shown in FIG. 3, the filling member 60 is disposed along, for example, the inner surface (a surface of the lid 50, the surface defining the first through-hole 57) of the first through-hole 57 and is in contact with the wirings 20, 22, and 24 and the first surface 11 of the base substance 10. Although not illustrated, the filling member 60 may be disposed so as to fully fill the first through-hole 57. The cavity 56 is hermetically sealed by the filling member 60. As the filling member 60, an insulating film such as a silicon oxide film (more specifically, a TEOS (Tetra Ethyl Ortho Silicate) film) or a silicon nitride (SiN) film, for example, is used.

The sealing member 70 is disposed within the second through-hole 58 to close the second through-hole 58. The cavity 56 is hermetically sealed by the sealing member 70. The material of the sealing member 70 is, for example, an alloy such as AuGe, AuSi, AuSn, SnPb, PbAg, SnAgCu, or SnZnBi.

The functional element 80 is supported on the first surface 11 of the base substance 10 (on the base substance 10). The functional element 80 is accommodated in the cavity 56 formed by the base substance 10 and the lid 50. In the following, a case will be described in which the functional element 80 is an acceleration sensor element (electrostatic capacitive MEMS acceleration sensor element) which detects acceleration in the horizontal direction (an X-axis direction).

As shown in FIGS. 1 and 2, the functional element 80 can include the fixed portions 81 and 82, coupling portions 84 and 85, the movable portion 86, the movable electrode portions 87, and the fixed electrode portions 88 and 89.

The movable portion 86 is displaced in the X-axis direction (a +X direction or a −X direction) while elastically deforming the coupling portions 84 and 85 according to a change in acceleration in the X-axis direction. With such displacement, the sizes of a clearance between the movable electrode portion 87 and the fixed electrode portion 88 and a clearance between the movable electrode portion 87 and the fixed electrode portion 89 change. That is, with such displacement, the magnitudes of an electrostatic capacitance between the movable electrode portion 87 and the fixed electrode portion 88 and an electrostatic capacitance between the movable electrode portion 87 and the fixed electrode portion 89 change. Based on changes in these electrostatic capacitances, the functional element 80 (the electronic device 100) can detect acceleration in the X-axis direction.

The fixed portions 81 and 82 are bonded to the first surface 11 of the base substance 10. In the illustrated example, the fixed portions 81 and 82 are disposed, in plan view, so as to stride over the circumferential edge of the recess 14.

The movable portion 86 is disposed between the fixed portion 81 and the fixed portion 82. In the example shown in FIG. 1, the planar shape of the movable portion 86 is a rectangle having long sides along the X-axis.

The coupling portions 84 and 85 couple the movable portion 86 to the fixed portions 81 and 82. The coupling portions 84 and 85 each have a desired spring constant and are configured to be able to displace the movable portion 86 in the X-axis direction. In the example shown in FIG. 1, the coupling portion 84 is configured of two beams 84a and 84b each having a shape extending in the X-axis direction while meandering in a Y-axis direction. Similarly, the coupling portion 85 is configured of two beams 85a and 85b each having a shape extending in the X-axis direction while meandering in the Y-axis direction.

The movable electrode portions 87 are connected to the movable portion 86. The plurality of movable electrode portions 87 are disposed. The movable electrode portions 87 protrude from the movable portion 86 in a +Y direction and a −Y direction and are arranged in parallel in the X-axis direction so as to form a comb-teeth shape.

One end portion of each of the fixed electrode portions 88 and 89 is bonded as a fixed end to the first surface 11 of the base substance 10, while the other end portion extends as a free end to the side of the movable portion 86. The plurality of fixed electrode portions 88 and the plurality of fixed electrode portions 89 are disposed. The fixed electrode portions 88 are electrically connected with the wiring 22, while the fixed electrode portions 89 are electrically connected with the wiring 24. The fixed electrode portions 88 and 89 are alternately arranged in parallel in the X-axis direction so as to form a comb-teeth shape. The fixed electrode portions 88 and 89 are disposed to face the movable electrode portions 87 with spacings relative to the movable electrode portions. The fixed electrode portion 88 is arranged on one side (the side of the −X direction) of the movable electrode portion 87, while the fixed electrode portion 89 is arranged on the other side (the side of the +X direction).

The fixed portions 81 and 82, the coupling portions 84 and 85, the movable portion 86, and the movable electrode portions 87 are integrally formed. The material of the functional element 80 is, for example, silicon doped with an impurity such as phosphorus or boron to provide conductivity.

A method for bonding the functional element 80 (the fixed portions 81 and 82 and the fixed electrode portions 88 and 89) and the base substance 10 together is not particularly limited. For example, when the material of the base substance 10 is glass and the material of the functional element 80 is silicon, the base substance 10 and the functional element 80 can be anodically bonded together.

In the electronic device 100, an electrostatic capacitance between the movable electrode portion 87 and the fixed electrode portion 88 can be measured using the external connection terminals 30 and 32. Further, in the electronic device 100, an electrostatic capacitance between the movable electrode portion 87 and the fixed electrode portion 89 can be measured using the external connection terminals 30 and 34. In the electronic device 100 as described above, the electrostatic capacitance between the movable electrode portion 87 and the fixed electrode portion 88 and the electrostatic capacitance between the movable electrode portion 87 and the fixed electrode portion 89 can be separately measured to detect, based on the measured results of the electrostatic capacitances, a physical quantity (acceleration) with high accuracy.

In the above, a case has been described in which the functional element 80 is an acceleration sensor element which detects acceleration in the X-axis direction. However, the functional element 80 may be an acceleration sensor element which detects acceleration in the Y-axis direction, or an acceleration sensor element which detects acceleration in the vertical direction (the Z-axis direction). Moreover, in the electronic device 100, a plurality of such functional elements 80 may be mounted. Moreover, the functional element 80 is not limited to an acceleration sensor element but may be, for example, a gyro sensor element which detects angular velocity, or a pressure sensor element.

The electronic device 100 has, for example, the following features.

According to the electronic device 100, the first through-hole 57 is disposed at the position of the lid 50, the position overlapping the groove portions 15, 16, and 17 in plan view, and the filling member 60 filling the groove portions 15, 16, and 17 is disposed within the first through-hole 57 and within the groove portions 15, 16, and 17. Therefore, the cavity 56 can be hermetically sealed by the filling member 60, so that the cavity 56 with high airtightness can be easily formed. As a result, the functional element 80 can have, for example, high detection sensitivity.

Further, in the electronic device 100, water resistance can be improved by hermetically sealing the cavity 56 with the filling member 60. For example, when the groove portion is filled with an adhesive member such as a resin, the airtightness or water resistance of the cavity is sometimes lowered.

According to the electronic device 100, the material of the base substance 10 is glass; the material of the lid 50 is silicon; and the base substance 10 and the lid 50 are anodically bonded together. With this configuration, the lid 50 can be strongly bonded to the base substance 10, so that the impact resistance of the electronic device 100 can be improved. Further, when, for example, the base substance and the lid are bonded together with an adhesive member such as glass frit, a region is required to some extent as a bonding margin because the adhesive member spreads in bonding. However, such a region can be reduced according to anodic bonding. Therefore, a reduction in the size of the electronic device 100 can be achieved.

According to the electronic device 100, the first through-hole 57 has a tapered shape in which the opening size of the first through-hole decreases toward the side of the base substance 10. Therefore, the filling member 60 can be easily formed on the inner surface of the first through-hole 57.

According to the electronic device 100, the filling member 60 is an insulating film. With this configuration, it is possible to prevent the wirings 20, 22, and 24 from short-circuiting with each other.

According to the electronic device 100, the second through-hole 58 in communication with the cavity 56 is disposed in the lid 50, and the sealing member 70 closing the second through-hole 58 is disposed within the second through-hole 58. Therefore, an inert gas (for example, nitrogen gas) atmosphere can be established in the cavity 56 through the second through-hole 58. Moreover, the degree of vacuum of the cavity 56 can be controlled through the second through-hole 58.

2. Method for Manufacturing Electronic Device

Next, a method for manufacturing the electronic device according to the embodiment will be described with reference to the drawings. FIGS. 4 to 9 are cross-sectional views schematically showing manufacturing steps of the electronic device 100 according to the embodiment.

Figure 4:
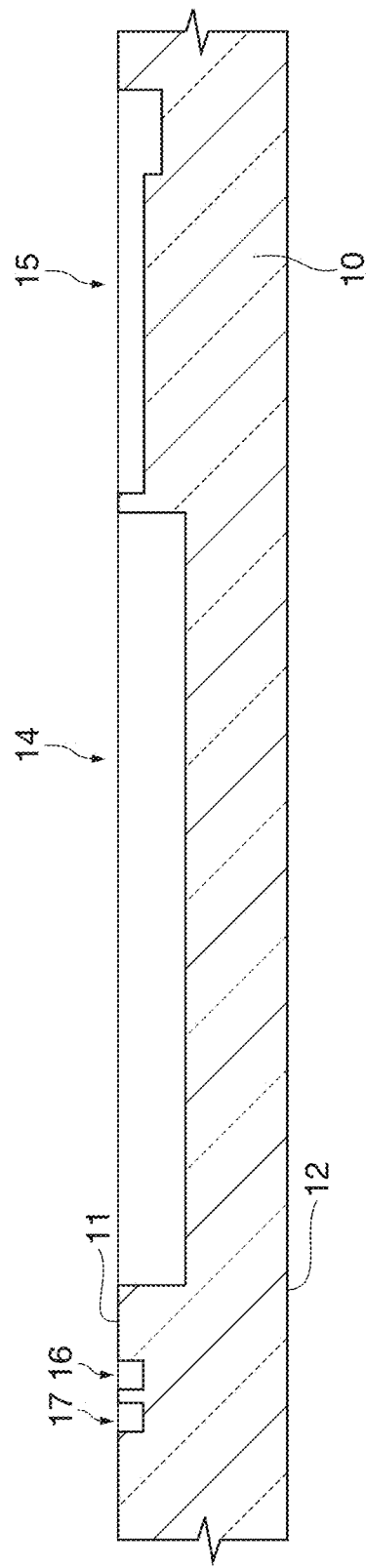
FIG. 4 is a cross-sectional view schematically showing a manufacturing step of the electronic device according to the embodiment.

As shown in FIG. 4, the recess 14 and the groove portions 15, 16, and 17 are formed in the first surface 11 of the base substance 10. The recess 14 and the groove portions 15, 16, and 17 are formed by, for example, a photolithographic technique and an etching technique. With this configuration, the base substance 10 having the recess 14 and the groove portions 15, 16, and 17 disposed on the first surface 11 can be prepared. The base substance 10 is made of, for example, glass.

Figure 5:
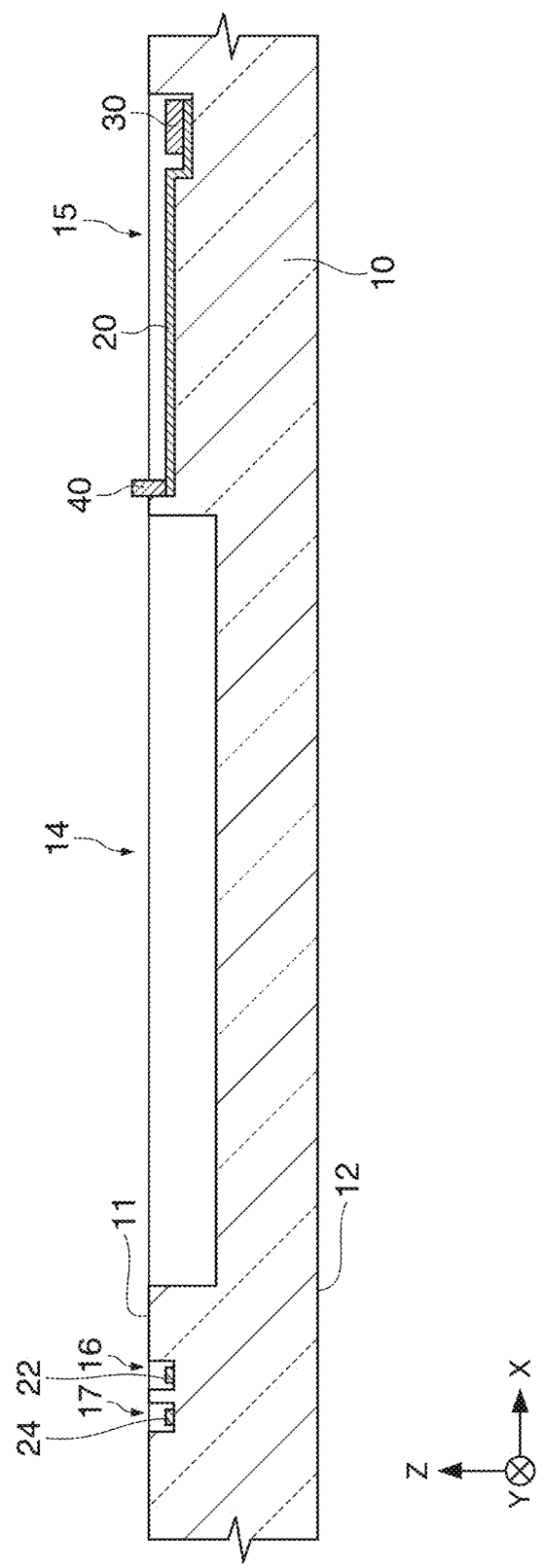
FIG. 5 is a cross-sectional view schematically showing a manufacturing step of the electronic device according to the embodiment.

As shown in FIG. 5, the wirings 20, 22, and 24 are formed within the groove portions 15, 16, and 17, respectively. Next, the external connection terminal 30 and the contact portion 40 are formed on the wiring 20 (on the side of the first surface 11 of the base substance 10) so as to be electrically connected with the wiring 20. Similarly, the external connection terminal 32 and the contact portions 42 are formed on the wiring 22 so as to be electrically connected with the wiring 22 (refer to FIG. 1). Moreover, the external connection terminal 34 and the contact portions 44 are formed on the wiring 24 so as to be electrically connected with the wiring 24 (refer to FIG. 1).

The wirings 20, 22, and 24 are formed by, for example, depositing a conductive layer (not shown) by a sputtering method, a CVD (Chemical Vapor Deposition) method, or the like and then patterning the conductive layer. The patterning is performed by a photolithographic technique and an etching technique. The external connection terminals 30, 32, and 34 and the contact portions 40, 42, and 44 are formed by, for example, the same method as that of the wirings 20, 22, and 24. Moreover, it is preferable that the contact portions 40, 42, and 44 protrude on the upper surface (the +Z direction) by a desired value beyond the groove portions 15, 16, and 17. According to this structure, since the contact portions 40, 42, and 44 are crushed in the bonding of the base substance 10 with a silicon substrate for forming the functional element 80 (described later), electrical connection with the silicon substrate can be performed more reliably.

Through the steps described above, the base substance 10 where the wirings 20, 22, and 24, the external connection terminals 30, 32, and 34, and the contact portions 40, 42, and 44 are disposed can be prepared.

Figure 6:
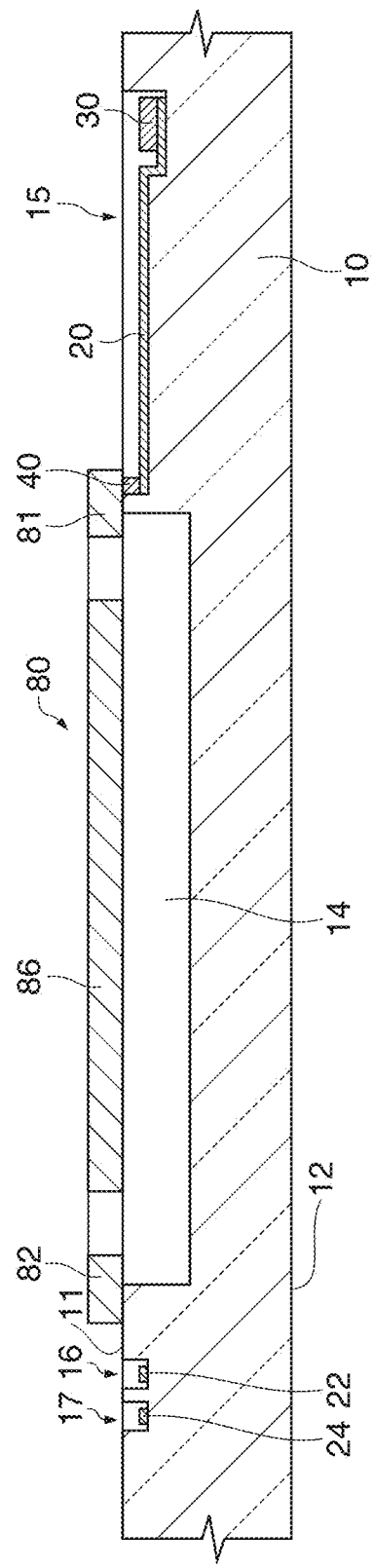
FIG. 6 is a cross-sectional view schematically showing a manufacturing step of the electronic device according to the embodiment.

As shown in FIG. 6, the functional element 80 is formed on the first surface 11 of the base substance 10 so as to be electrically connected with the wirings 20, 22, and 24. More specifically, the functional element 80 is formed by placing (bonding) the silicon substrate (not shown) on the first surface 11 so as to overlap the recess 14 in plan view, thinning the silicon substrate, and then patterning the silicon substrate. The patterning is performed by a photolithographic technique and an etching technique. The bonding of the silicon substrate and the base substance 10 together can be performed by anodic bonding as described above.

Figure 7:
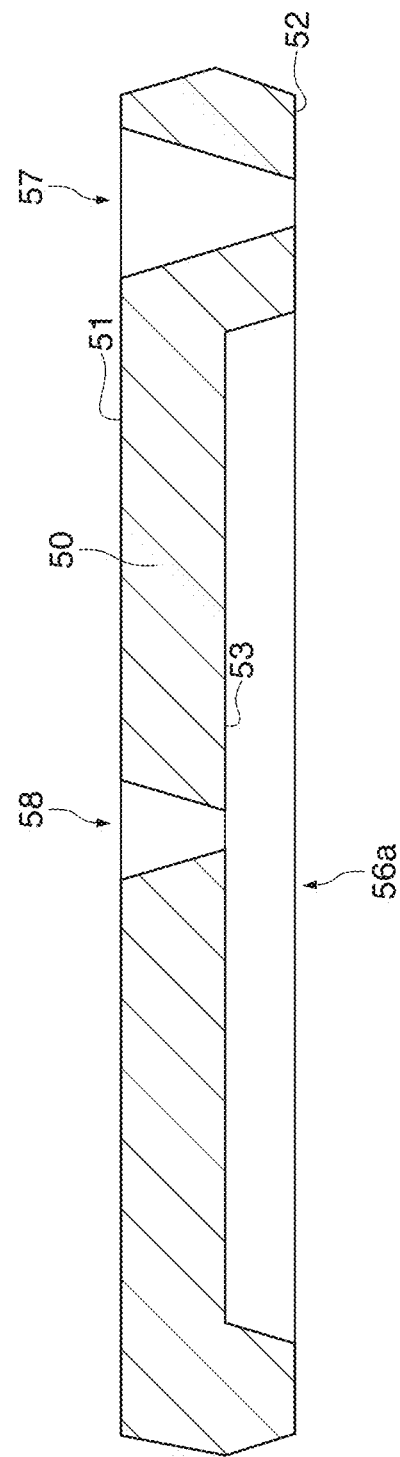
FIG. 7 is a cross-sectional view schematically showing a manufacturing step of the electronic device according to the embodiment.

As shown in FIG. 7, a recess 56a serving as the cavity 56 is formed in the fourth surface 52 of the lid 50. Next, the first through-hole 57 penetrating from the third surface 51 to the fourth surface 52 of the lid 50 and the second through-hole 58 penetrating from the third surface 51 to the fifth surface 53 of the lid 50 are formed. The lid 50 is made of, for example, silicon.

The recess 56a and the through-holes 57 and 58 are formed by a photolithographic technique and an etching technique. More specifically, the recess 56a is formed by wet etching from the side of the fourth surface 52. The through-holes 57 and 58 are formed by wet etching from the side of the third surface 51. By forming the through-holes 57 and 58 by wet etching, the through-holes 57 and 58 each can be made into a tapered shape. When the lid 50 where the through-holes 57 and 58 are disposed is formed by processing a (100) silicon substrate by wet etching, the inner surface of each of the through-holes 57 and 58 is a (111) surface or a surface equivalent to the (111) surface.

The first through-hole 57 and the second through-hole 58 may be formed by the same wet etching step or by separate wet etching steps. Moreover, the order of the step of forming the recess 56*a* and the step of forming the through-holes 57 and 58 is not limited.

Through the steps described above, the lid 50 where the recess 56*a* and the through-holes 57 and 58 are disposed can be prepared.

The order of the step of preparing the base substance 10 where the wirings 20, 22, and 24, the external connection terminals 30, 32, and 34, and the contact portions 40, 42, and 44 are disposed and the step of preparing the lid 50 where the recess 56*a* and the through-holes 57 and 58 are disposed is not limited.

Moreover, the order of the step of forming the functional element 80 on the first surface 11 of the base substance 10 and the step of preparing the lid 50 where the recess 56*a* and the through-holes 57 and 58 are disposed is not limited.

Figure 8:
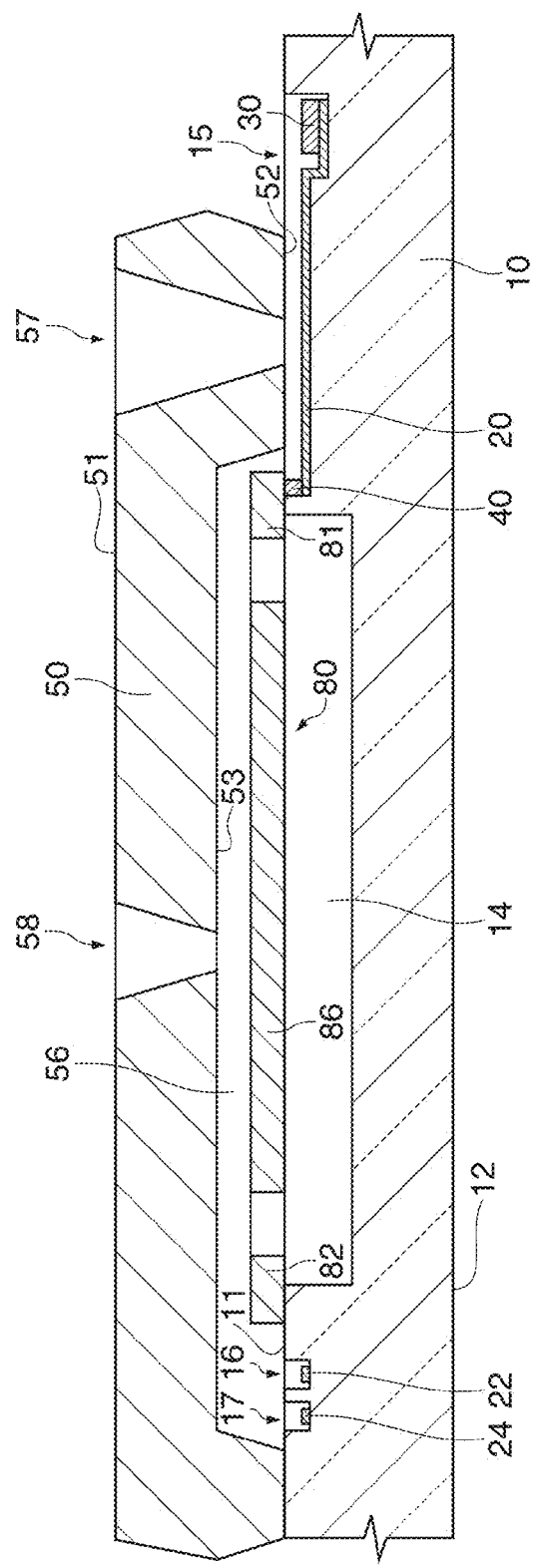
FIG. 8 is a cross-sectional view schematically showing a manufacturing step of the electronic device according to the embodiment.

As shown in FIG. 8, the lid 50 and the base substance 10 are bonded together such that the first through-hole 57 and the groove portion 15 overlap each other in plan view, to accommodate the functional element 80 in the cavity 56 formed by the base substance 10 and the lid 50. The bonding of the base substance 10 and the lid 50 together can be performed by anodic bonding as described above.

Figure 9:
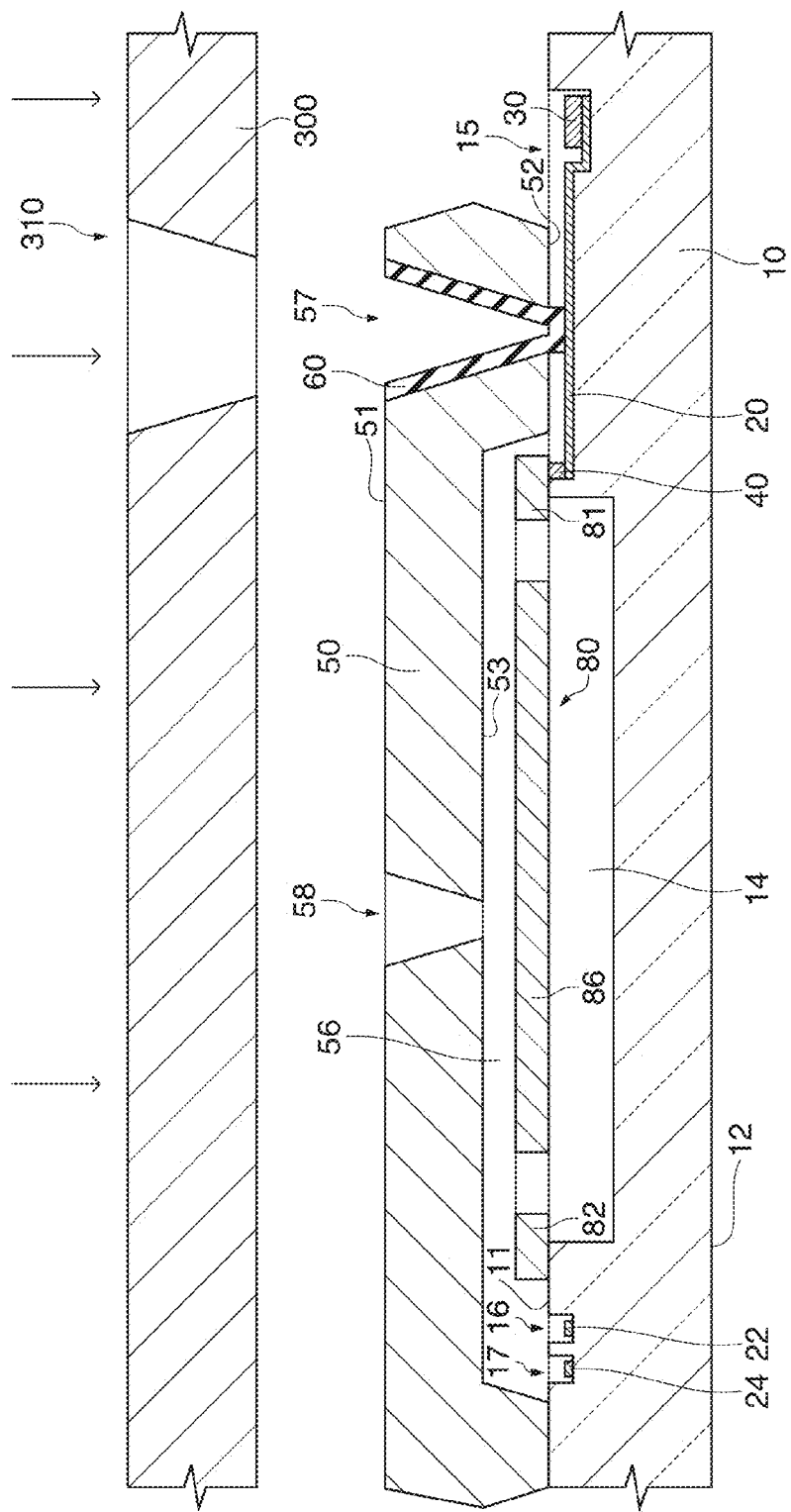
FIG. 9 is a cross-sectional view schematically showing a manufacturing step of the electronic device according to the embodiment.

As shown in FIG. 9, the filling member 60 is formed within the first through-hole 57 and within the groove portion 15 so as to fill the groove portion 15. More specifically, the filling member 60 is filled within the groove portion 15 from the first through-hole 57 (through the first through-hole 57). The filling member 60 is also formed within the groove portions 16 and 17, so that the groove portions 16 and 17 can be filled (refer to FIG. 3). The filling member 60 is deposited by a CVD method or the like. In this case, it is preferable to use a mask 300 having a through-hole 310 at a position corresponding to the first through-hole 57 prepared in advance. For the mask 300, a metal mask, a silicon mask, or the like, for example, can be used. By using this method, an insulating film serving as the filling member 60 is unlikely to be deposited at other than the first through-hole 57. Therefore, a patterning step is no more necessary, so that the simplification of the steps is possible.

Next, the atmosphere of the cavity 56 is controlled with the second through-hole 58. For example, an inert gas (nitrogen gas) atmosphere may be established in the cavity 56 through the second through-hole 58, or a reduced-pressure state may be established.

By forming the filling member 60 in a reduced-pressure state like a CVD method or the like, the step of establishing a reduced-pressure state in the cavity 56 through the second through-hole 58 can be omitted. That is, the second through-hole 58 may not be disposed. With this configuration, the simplification of the steps can be achieved. For example, when the functional element 80 is a gyro sensor element, it is desirable that a reduced-pressure state is established in the cavity 56. With this configuration, the attenuation of a vibration phenomenon of a gyro sensor element due to the viscosity of air can be suppressed.

As shown in FIG. 2, the sealing member 70 is formed within the second through-hole 58 to close the second through-hole 58. More specifically, the sealing member 70 is formed by arranging a spherical solder ball (not shown) within the second through-hole 58 and melting the solder ball by laser irradiation. The cavity 56 can be hermetically sealed by the filling member 60 and the sealing member 70.

Through the steps described above, the electronic device 100 can be manufactured.

The method for manufacturing the electronic device 100 has, for example, the following features.

According to the method for manufacturing the electronic device 100, the first through-hole 57 is formed at the position of the lid 50, the position overlapping the groove portions 15, 16, and 17 in plan view, and the filling member 60 filling the groove portions 15, 16, and 17 can be formed within the first through-hole 57 and within the groove portions 15, 16, and 17. Therefore, the cavity 56 can be hermetically sealed, so that the electronic device 100 including the cavity 56 with high airtightness can be easily formed by, for example, a processing technique used in the manufacture of a semiconductor device.

Further, in the method for manufacturing the electronic device 100, the material of the base substance 10 is glass; the material of the lid 50 is silicon; and the bonding of the base substance 10 and the lid 50 together is performed by anodic bonding. With this configuration, the lid 50 can be strongly bonded to the base substance 10, so that an improvement in the impact resistance of the electronic device 100 can be achieved. Further, when, for example, the base substance and the lid are bonded together with an adhesive member such as glass frit, a region is required to some extent as a bonding margin because the adhesive member spreads in bonding. However, such a region can be reduced according to anodic bonding. Therefore, a reduction in the size of the electronic device 100 can be achieved.

According to the method for manufacturing the electronic device 100, the first through-hole 57 is formed by wet etching. Therefore, the first through-hole 57 can be made into a tapered shape in which the opening size of the first through-hole decreases toward the side of the base substance 10. With this configuration, the filling member 60 can be easily formed on the inner surface of the first through-hole 57.

3. Modified Example of Electronic Device

Figure 10:
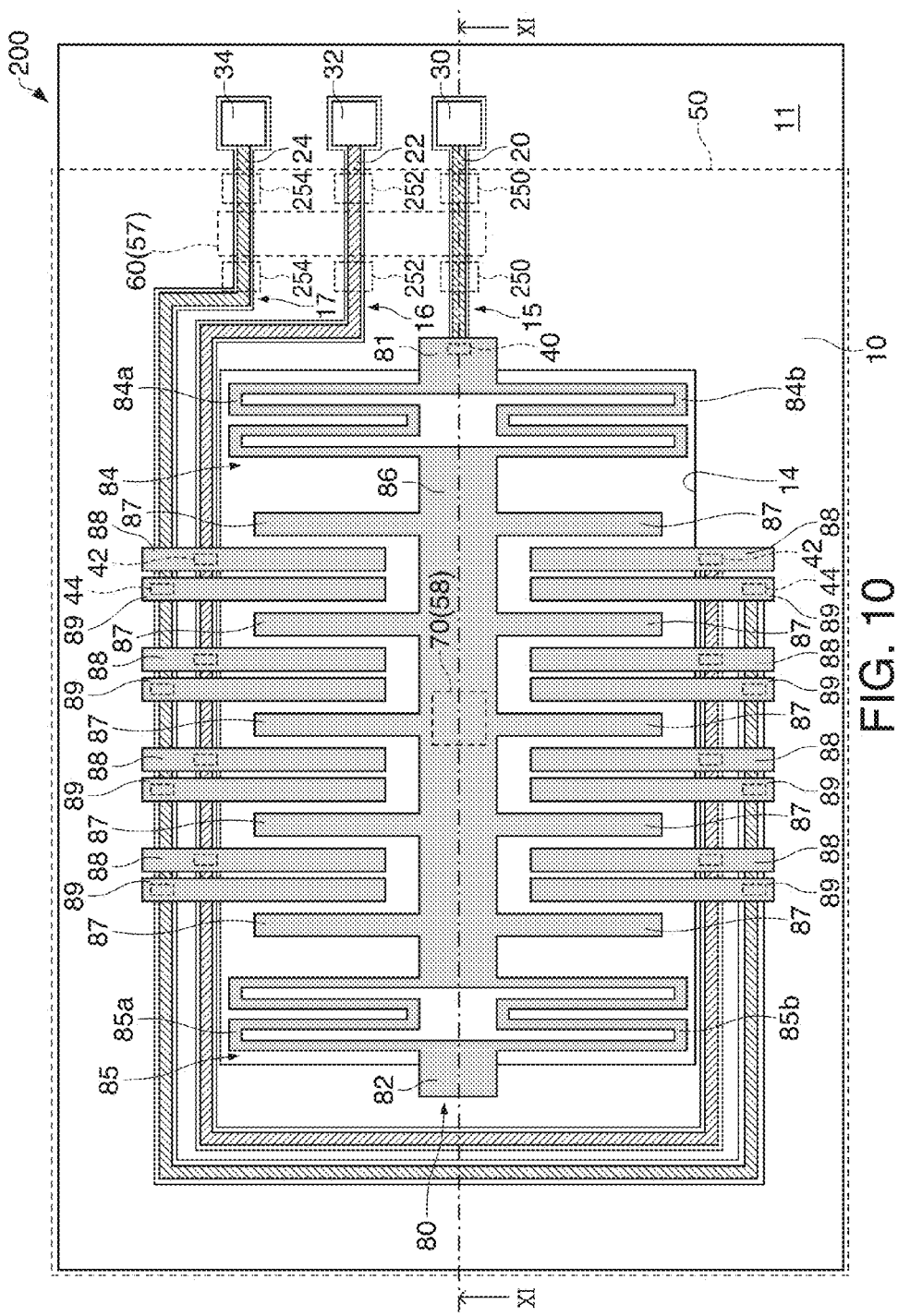
FIG. 10 is a plan view schematically showing an electronic device according to a modified example of the embodiment.
Figure 11:
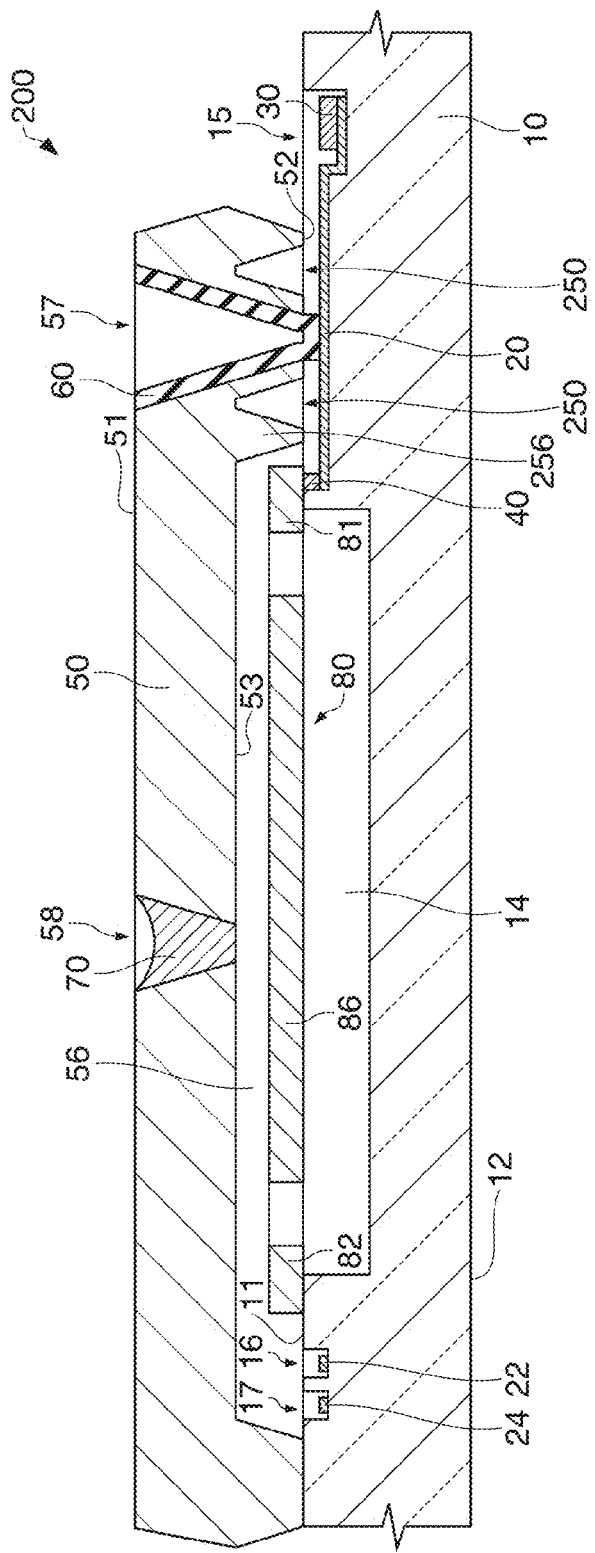
FIG. 11 is a cross-sectional view schematically showing the electronic device according to the modified example of the embodiment.

Next, an electronic device according to a modified example of the embodiment will be described with reference to the drawings. FIG. 10 is a plan view schematically showing the electronic device 200 according to the modified example of the embodiment. FIG. 11 is a cross-sectional view taken along line XI-XI of FIG. 10, schematically showing the electronic device 200 according to the modified example of the embodiment. For convenience sake, the lid 50, the filling member 60, and the sealing member 70 are illustrated in a perspective manner in FIG. 10.

Hereinafter, in the electronic device 200 according to the modified example of the embodiment, members having functions similar to those of the constituent members of the electronic device 100 according to the embodiment are denoted by the same reference numerals and signs, and therefore the detailed descriptions thereof are omitted.

In the electronic device 200 as shown in FIGS. 10 and 11, recesses 250, 252, and 254 are disposed in the fourth surface 52 of the lid 50. More specifically, the recesses 250 are disposed at portions (facing portions) of the fourth surface 52, the portions being arranged to face the wiring 20. In the example shown in FIG. 11, the two recesses 250 are disposed above the wiring 20 so as to interpose the first through-hole 57 therebetween.

Similarly, the recesses 252 are disposed at portions of the fourth surface 52, the portions being arranged to face the wiring 22. The recesses 254 are disposed at portions of the fourth surface 52, the portions being arranged to face the wiring 24.

The recesses 250, 252, and 254 can be formed at the same time as when, for example, the recess 56a serving as the cavity 56 (refer to FIG. 7) is formed.

The electronic device 200 has, for example, the following features.

According to the electronic device 200, a parasitic capacitance between the wiring 20 and the lid 50 can be reduced due to the recesses 250, compared to, for example, the electronic device 100. Similarly, a parasitic capacitance between the wiring 22 and the lid 50 can be reduced due to the recesses 252, and a parasitic capacitance between the wiring 24 and the lid 50 can be reduced due to the recesses 254. With this configuration, the high sensitivity of the electronic device 200 can be achieved. Especially when the functional element 80 is an electrostatic capacitive acceleration sensor element or gyro sensor element, the functional element 80 is sensitive to a parasitic capacitance. Therefore, it is desirable that the parasitic capacitances between the lid 50 and the wirings 20, 22, and 24 are small.

According to the electronic device 200, the recesses 250, 252, and 254 are disposed corresponding to the wirings 20, 22, and 24. Therefore, compared to the case in which, for example, the recesses 250, 252, and 254 are continuous to form one recess, the area of the recesses can be reduced, so that a reduction in the strength of the lid 50 can be suppressed.

Although not illustrated, the recess 250 may be continuous with the cavity 56. That is, a wall portion 256 of the lid 50 between the recess 250 and the cavity 56 may not be disposed, whereby the recess 250 and the cavity 56 may be continuous with each other. Similarly, each of the recesses 252 and 254 and the cavity 56 may be continuous with each other.

Although not illustrated, the recesses 250, 252, and 254 disposed on one side (the side of the −X direction) of the first through-hole 57 may be continuous with each other. Similarly, the recesses 250, 252, and 254 disposed on the other side (the side of the +X direction) of the first through-hole 57 may be continuous with each other.

4. Electronic Apparatuses

Next, electronic apparatuses according to the embodiment will be described with reference to the drawings. The electronic apparatuses according to the embodiment include any of the electronic devices according to the invention. In the following, electronic apparatuses including the electronic device 100 as the electronic device according to the invention will be described.

Figure 12:
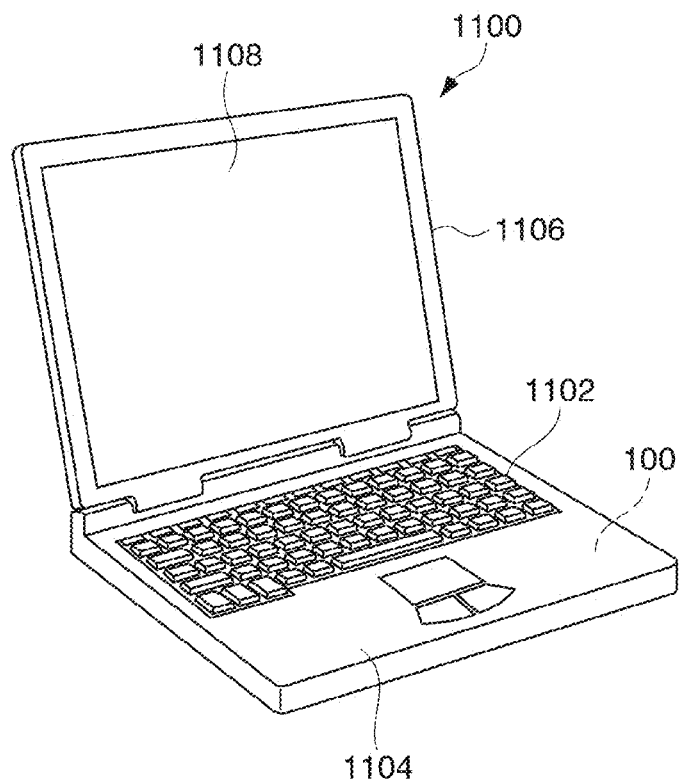
FIG. 12 is a perspective view schematically showing an electronic apparatus according to the embodiment.

FIG. 12 is a perspective view schematically showing a mobile (or notebook) personal computer 1100 as an electronic apparatus according to the embodiment.

As shown in FIG. 12, the personal computer 1100 is configured of a main body portion 1104 including a keyboard 1102 and a display unit 1106 having a display portion 1108. The display unit 1106 is rotationally movably supported relative to the main body portion 1104 via a hinge structure portion.

In the personal computer 1100, the electronic device 100 is incorporated.

Figure 13:
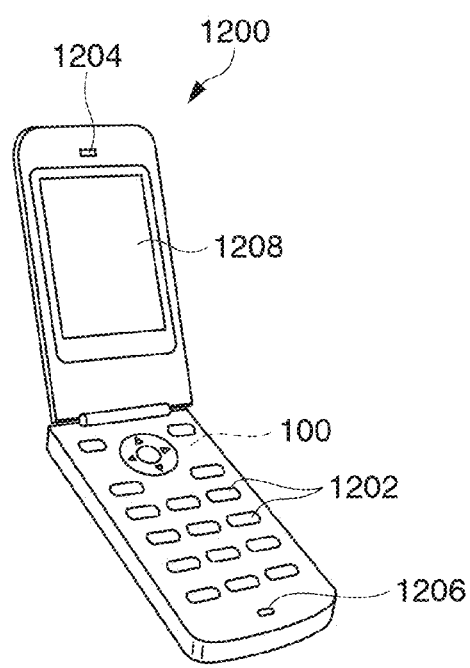
FIG. 13 is a perspective view schematically showing an electronic apparatus according to the embodiment.

FIG. 13 is a perspective view schematically showing a cellular phone (including a PHS) 1200 as an electronic apparatus according to the embodiment.

As shown in FIG. 13, the cellular phone 1200 includes a plurality of operation buttons 1202, an earpiece 1204, and a mouthpiece 1206. A display portion 1208 is arranged between the operation buttons 1202 and the earpiece 1204.

In the cellular phone 1200, the electronic device 100 is incorporated.

Figure 14:
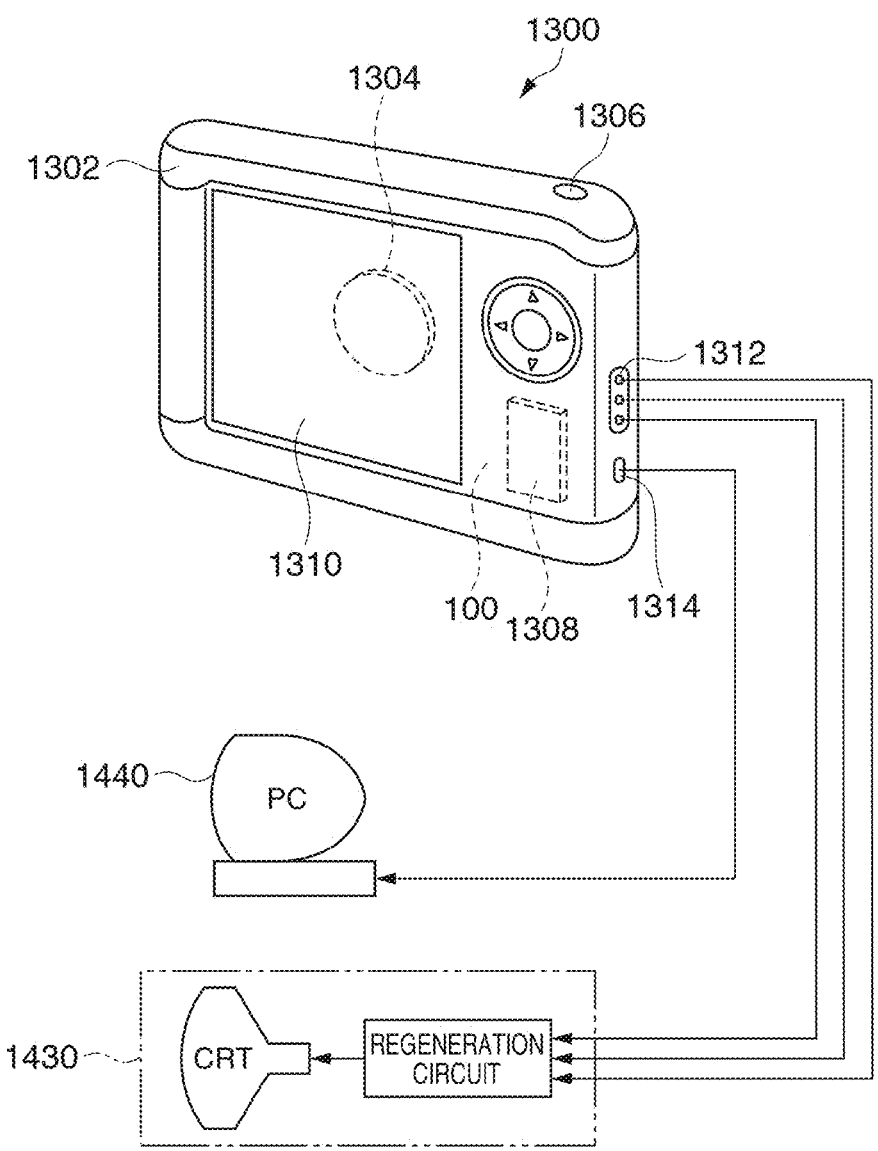
FIG. 14 is a perspective view schematically showing an electronic apparatus according to the embodiment.

FIG. 14 is a perspective view schematically showing a digital still camera 1300 as an electronic apparatus according to the embodiment. In FIG. 14, connections with external apparatuses are also shown in a simplified manner.

Here, usual cameras expose a silver halide photographic film with an optical image of a subject, whereas the digital still camera 1300 generates imaging signals (image signals) by photoelectrically converting an optical image of a subject with an imaging element such as a CCD (Charge Coupled Device).

A display portion 1310 is disposed on the back surface of a case (body) 1302 in the digital still camera 1300 and configured to perform display based on imaging signals generated by a CCD. The display portion 1310 functions as a finder which displays a subject as an electronic image.

Moreover, on the front side (the rear side in the drawing) of the case 1302, a light receiving unit 1304 including an optical lens (imaging optical system) and a CCD is disposed.

When a photographer confirms a subject image displayed on the display portion 1310 and presses down a shutter button 1306, imaging signals of a CCD at the time are transferred to and stored in a memory 1308.

Moreover, in the digital still camera 1300, a video signal output terminal 1312 and a data communication input/output terminal 1314 are disposed on the side surface of the case 1302. Then, a television monitor 1430 and a personal computer 1440 are connected as necessary to the video signal output terminal 1312 and the data communication input/output terminal 1314, respectively. Further, the digital still camera 1300 is configured such that the imaging signals stored in the memory 1308 are output to the television monitor 1430 or the personal computer 1440 by a predetermined operation.

In the digital still camera 1300, the electronic device 100 is incorporated.

The electronic apparatuses 1100, 1200, and 1300 described above include the electronic device 100 in which the cavity 56 with high airtightness can be easily formed. Therefore, the electronic apparatuses 1100, 1200, and 1300 can have high sensitivity.

An electronic apparatus including the electronic device 100 can be applied to for example, in addition to the personal computer (mobile personal computer) shown in FIG. 12, the cellular phone shown in FIG. 13, and the digital still camera shown in FIG. 14, inkjet ejection apparatuses (for example, inkjet printers), laptop personal computers, television sets, video camcorders, video tape recorders, various kinds of navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, rockets, and ships), the attitude control of robots, the human body, or the like, and flight simulators.

The invention includes a configuration (for example, a configuration having the same function, method, and result, or a configuration having the same advantage and effect) which is substantially the same as those described in the embodiment. Moreover, the invention includes a configuration in which a non-essential portion of the configurations described in the embodiment is replaced. Moreover, the invention includes a configuration providing the same operational effects as those described in the embodiment, or a configuration capable of achieving the same advantages. Moreover, the invention includes a configuration in which a publicly known technique is added to the configurations described in the embodiment.

The entire disclosure of Japanese Patent Application No. 2012-026170, filed Feb. 9, 2012 is expressly incorporated by reference herein.

What is claimed is:

1. An electronic device comprising:
   a first member having a first surface;
   a second member placed on the first surface of the first member;
   a cavity formed between the first and second members;
   a functional element accommodated in the cavity;
   an external connection terminal disposed outside of the cavity on the first surface of the first member;
   a groove formed in the first surface of the first member, the groove extending from inside of the cavity to the external connection terminal;
   a wiring disposed within the groove and electrically connecting the functional element with the external connection terminal;
   a first through-hole disposed at a position of the second member, the position overlapping the groove in a plan view; and
   a filling member disposed within the first through-hole, wherein
   a depth of the groove is larger than a thickness of the wiring so that an aft gap is provided between the second member and a top surface of the wiring, and
   the filling member is formed in the air gap of the groove below the second member so that no air communication is permitted between the inside of the cavity and the external connection terminal via the groove.

2. The electronic device according to claim 1, wherein
   the first member is glass,
   the second member is silicon, and
   the first member and the second member are anodically bonded together.

3. The electronic device according to claim 1, wherein
   the first through-hole has a tapered shape in which an opening size of the first through-hole decreases toward the first member.

4. The electronic device according to claim 1, wherein
   the filling member is an insulating film.

5. The electronic device according to claim 1, further comprising:
   a second through-hole disposed in the second member above the cavity and being in communication with the cavity; and
   a sealing member closing the second through-hole.

6. The electronic device according to claim 1, wherein
   a recess is disposed in a surface of the second member, the surface facing the wiring.

7. An electronic apparatus comprising the electronic device according to claim 1.

* * * * *